United States Patent
Chih et al.

(10) Patent No.: US 10,366,765 B2
(45) Date of Patent: Jul. 30, 2019

(54) ADJUSTMENT CIRCUIT FOR PARTITIONED MEMORY BLOCK

(71) Applicant: Taiwan Semiconductor Manufacturing Co., Ltd., Hsinchu (TW)

(72) Inventors: Yu-Der Chih, Hsinchu (TW); Hung-Chang Yu, Hsinchu (TW); Ku-Feng Lin, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/635,887

(22) Filed: Jun. 28, 2017

(65) Prior Publication Data

US 2018/0174656 A1 Jun. 21, 2018

Related U.S. Application Data

(60) Provisional application No. 62/434,617, filed on Dec. 15, 2016.

(51) Int. Cl.

| | |
|---|---|
| *G11C 16/28* | (2006.01) |
| *G11C 16/08* | (2006.01) |
| *G11C 16/32* | (2006.01) |
| *G11C 16/34* | (2006.01) |
| *G11C 29/02* | (2006.01) |
| *G11C 7/04* | (2006.01) |

(52) U.S. Cl.
CPC ............. *G11C 16/28* (2013.01); *G11C 7/04* (2013.01); *G11C 16/08* (2013.01); *G11C 16/32* (2013.01); *G11C 16/3445* (2013.01); *G11C 16/3459* (2013.01); *G11C 29/021* (2013.01); *G11C 29/028* (2013.01)

(58) Field of Classification Search
CPC ......... G11C 16/28; G11C 16/08; G11C 16/32; G11C 16/3445; G11C 16/3459; G11C 7/04; G11C 29/021; G11C 29/028
USPC .................................................... 365/185.22
See application file for complete search history.

(56) References Cited

U.S. PATENT DOCUMENTS

| | | | |
|---|---|---|---|
| 6,191,988 B1 | 2/2001 | DeBrosse | |
| 7,564,716 B2* | 7/2009 | Syzdek | G11C 16/28 |
| | | | 365/185.2 |
| 8,127,113 B1* | 2/2012 | Sinha | G06F 9/54 |
| | | | 710/112 |
| 8,723,559 B2 | 5/2014 | Chen et al. | |
| 2003/0058692 A1 | 3/2003 | Shiga | |

(Continued)

*Primary Examiner* — Sung Il Cho
(74) *Attorney, Agent, or Firm* — Sterne, Kessler, Goldstein & Fox P.L.L.C.

(57) ABSTRACT

The present disclosure describes an adjustment circuit that can be used, for example, in a memory system with partitioned memory blocks. The adjustment circuit can include a controller circuit, a timer circuit, and a temperature adaptive reference (TAR) generator. The controller circuit can be configured to output a control signal that indicates a memory type (e.g., code memory or data memory) associated with a partitioned memory block. The timer circuit can be configured to output a timing signal for a read memory operation based on the control signal. And, the TAR generator can be configured to adjust a verify reference current for a verify memory operation based on temperature, where the verify reference current is set based on the control signal.

20 Claims, 8 Drawing Sheets

(56) References Cited

U.S. PATENT DOCUMENTS

| | | | | |
|---|---|---|---|---|
| 2007/0001659 A1* | 1/2007 | Kasai | ................... | G09G 3/3283 |
| | | | | 323/315 |
| 2007/0016728 A1* | 1/2007 | Zhu | ................... | G06F 13/4239 |
| | | | | 711/115 |
| 2009/0289697 A1* | 11/2009 | Gabillard | ................. | G05F 3/30 |
| | | | | 327/539 |
| 2010/0074028 A1* | 3/2010 | Hirose | ................... | G11C 5/145 |
| | | | | 365/185.29 |
| 2012/0026820 A1* | 2/2012 | Pu | .......................... | G11C 7/22 |
| | | | | 365/222 |
| 2013/0094288 A1* | 4/2013 | Patapoutian | ........... | G11C 16/06 |
| | | | | 365/185.03 |
| 2014/0049314 A1* | 2/2014 | Polley | ................... | H03H 11/02 |
| | | | | 327/530 |
| 2014/0119126 A1* | 5/2014 | Dutta | ................. | G11C 11/5628 |
| | | | | 365/185.19 |
| 2014/0254264 A1* | 9/2014 | Dutta | ................ | G11C 16/3459 |
| | | | | 365/185.03 |
| 2015/0085593 A1* | 3/2015 | Mu | ......................... | G11C 7/08 |
| | | | | 365/208 |
| 2015/0170746 A1* | 6/2015 | Oowada | ................ | G11C 16/10 |
| | | | | 365/185.18 |
| 2016/0071590 A1* | 3/2016 | Hsu | ................... | G11C 14/0018 |
| | | | | 365/185.08 |
| 2016/0259570 A1* | 9/2016 | Agarwal | ................ | G06F 11/00 |
| 2016/0276038 A1* | 9/2016 | Kanda | ................... | G11C 16/10 |
| 2016/0284386 A1* | 9/2016 | McCall | ............... | G11C 7/1057 |
| 2016/0292557 A1* | 10/2016 | Kolman | ............ | G06K 19/0724 |
| 2018/0308554 A1 | 10/2018 | Chih et al. | | |

* cited by examiner

ADJUSTMENT CIRCUIT FOR PARTITIONED MEMORY BLOCK

CROSS-REFERENCE TO RELATED APPLICATION

This application claims the benefit of U.S. Provisional Patent Application No. 62/434,617, titled "Adjustment Circuit for Partitioned Memory Block," filed on Dec. 15, 2016, which is incorporated by reference herein in its entirety.

BACKGROUND

A memory device is an integral component of a computer system. For example, the memory device can be used to store computer code executed by an application running on the computer system. In another example, the memory device can be used to store data such as, for example, documents, pictures, and music. As computing demands increase, the demands on memory device density and optimization increase accordingly to meet the computing demands.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

Figure 1:
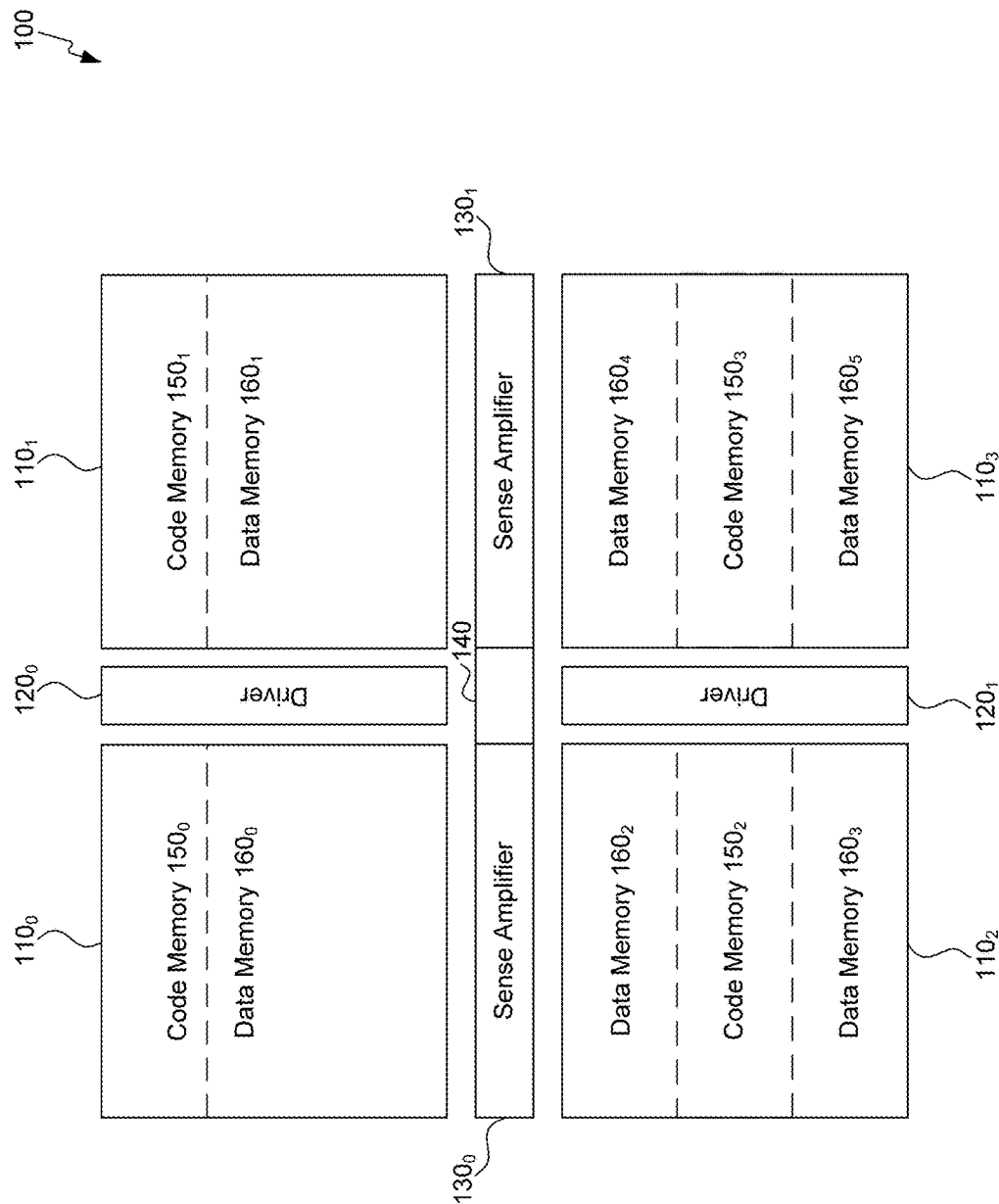
FIG. 1 is an illustration of a memory system, according to some embodiments.

The following disclosure provides many different embodiments, or examples, for implementing different features of the provided subject matter. Specific examples of components and arrangements are described below to simplify the present disclosure. These are merely examples and are not intended to be limiting. In addition, the present disclosure repeats reference numerals and/or letters in the various examples. This repetition is for the purpose of simplicity and clarity and, unless indicated otherwise, does not in itself dictate a relationship between the various embodiments and/or configurations discussed.

The following disclosure describes aspects of a memory system. For ease of explanation, certain circuit elements and control logic of the memory system are disclosed to facilitate in the description of the different embodiments. A person of ordinary skill in the art will understand that the memory system includes other circuit elements and control logic. These other circuit elements and control logic are within the spirit and scope of this disclosure.

The memory system can include a memory array with partitioned memory blocks, an adjustment circuit, and a driver circuit. In some embodiments, one or more of the memory blocks can be partitioned into different memory sectors—e.g., code memory sectors and data memory sectors. As described in detail below, for verify memory operations (e.g., program verify or erase verify), a verify reference current can be selected by the adjustment circuit based on memory type (e.g., code memory or data memory). To improve a read window of the memory system, in some embodiments, the adjustment circuit can include a temperature adaptive reference generator to adjust the verify reference current based on temperature. Further, to improve read performance of the memory system, the memory system can include a driver circuit with a "boost" function to reduce or lessen a wordline voltage settling period, according to some embodiments. These benefits of the present disclosure are described in detail below.

FIG. 1 is an illustration of a memory system 100, according to some embodiments. Memory system 100 includes a memory array 110 divided into memory blocks $110_0$-$110_3$, driver circuits $120_0$-$120_1$, sense amplifier circuits $130_0$-$130_1$, and an adjustment circuit 140. Based on the description herein, a person of ordinary skill in the art will recognize that memory array 110 can be divided into more or less memory blocks than the number of memory blocks shown in FIG. 1. These other memory block configurations are within the spirit and scope of the present disclosure. A person of ordinary skill in the art will also recognize that the arrangement of the memory blocks, driver circuits, sense amplifier circuits, and adjustment circuit is not limited to the configuration shown in FIG. 1 and that other configurations are possible. These other configurations are also within the spirit and scope of the present disclosure.

Each of memory blocks $110_0$-$110_3$ can include a plurality of flash memory cells arranged in a matrix format of rows and columns, according to some embodiments. As would be understood by a person of ordinary skill in the art, the matrix format can be arranged such that flash memory cells along a row share a common wordline, and flash memory cells along a column share a common bitline. Thus, the matrix of flash memory cells has rows corresponding to wordlines and columns corresponding to bitlines. Depending on the number of flash memory cells in each of memory blocks $110_0$-$110_3$, each of memory blocks $110_0$-$110_3$ can have a plurality of wordlines and a plurality of bitlines arranged in the matrix format. For example purposes, embodiments of the present disclosure are described in the context of memory blocks $110_0$-$110_3$ with flash memory cells. Based on the description herein, a person of ordinary skill in the art will recognize that other types of memory cells can be used in memory blocks $110_0$-$110_3$. These other types of memory cells are within the spirit and scope of the present disclosure.

In some embodiments, one or more of memory blocks $110_0$-$110_3$ can be partitioned into two or more memory sectors to store different types of memory. These different types of memory include (i) code memory such as, for example, computer code executed by an application running on a computer system and (ii) data memory such as, for example, data associated with documents, pictures, and music. An example partitioning of memory blocks $110_0$-$110_3$ is as follows:

- memory block $110_0$ is partitioned into two memory sectors: (i) code memory sector $150_0$ and (ii) data memory sector $160_0$;
- memory block $110_1$ is partitioned into two memory sectors: (i) code memory sector $150_1$ and (ii) data memory sector $160_1$;
- memory block $110_2$ is partitioned into three memory sectors: (i) data memory sector $160_2$, (ii) code memory sector $150_2$, and (iii) data memory sector $160_3$; and
- memory block $110_3$ is partitioned into three memory sectors: (i) data memory sector $160_4$, (ii) code memory sector $150_3$, and (iii) data memory sector $160_5$.

In some embodiments, the amount of memory space for each data memory sector is flexible such that a computer system implementing memory system 100 can dynamically adjust the memory space allocated to these memory sectors. For example, during operation, the computer system may determine that less memory space is needed to store data memory. As a result, to optimize the amount of memory space allocated to code and data memory types, the computer system may allocate more memory space to code memory and less memory space to data memory. Based on the description herein, in addition to code and data memory types, a person of ordinary skill in the art will recognize that memory blocks $110_0$-$110_3$ can store other types of memory. These other types of memory are within the spirit and scope of the present disclosure.

Further, as will be described in detail below, the code memory and data memory sectors can have different verify reference currents based on a frequency that the memory sectors are accessed. For example, the data memory sector may be accessed at a higher rate than the code memory sector due to computer applications storing and/or deleting data—e.g., associated with documents, pictures, and music—at a higher rate than the storage and deletion of code memory. The data memory sector can be considered "high endurance" because of its frequent exposure to high voltages during program and erase memory operations, whereas the code memory sector can be considered "low endurance" because it has less exposure to the high voltages. For example, the data memory can undergo over 1 million program/erase cycles, whereas the code memory can undergo less than 10 thousand program/erase cycles. To mitigate stress breakdown in the data memory sector, a lower verify reference current can be used in the data memory sector as compared to the verify reference current used in the code memory sector. By using a lower verify reference current for the data memory cells, these cells are erased more lightly, thus mitigating gate oxide stress and extending cycling endurance.

In referring to FIG. 1, driver circuits $120_0$ and $120_1$ provide wordline voltages to memory blocks $110_0$-$110_3$. These wordline voltages are associated with various memory operations such as, for example, program, read, erase, and verify modes of operation. In some embodiments, driver circuit $120_0$ provides wordline voltages to memory blocks $110_0$ and $110_1$. Similarly, driver circuit $120_1$ provides wordline voltages to memory blocks $110_2$ and $110_3$. Though not illustrated in FIG. 1, in some embodiments, a single driver circuit or more than two driver circuits can provide wordline voltages to memory blocks $110_0$-$110_3$.

Figure 2:
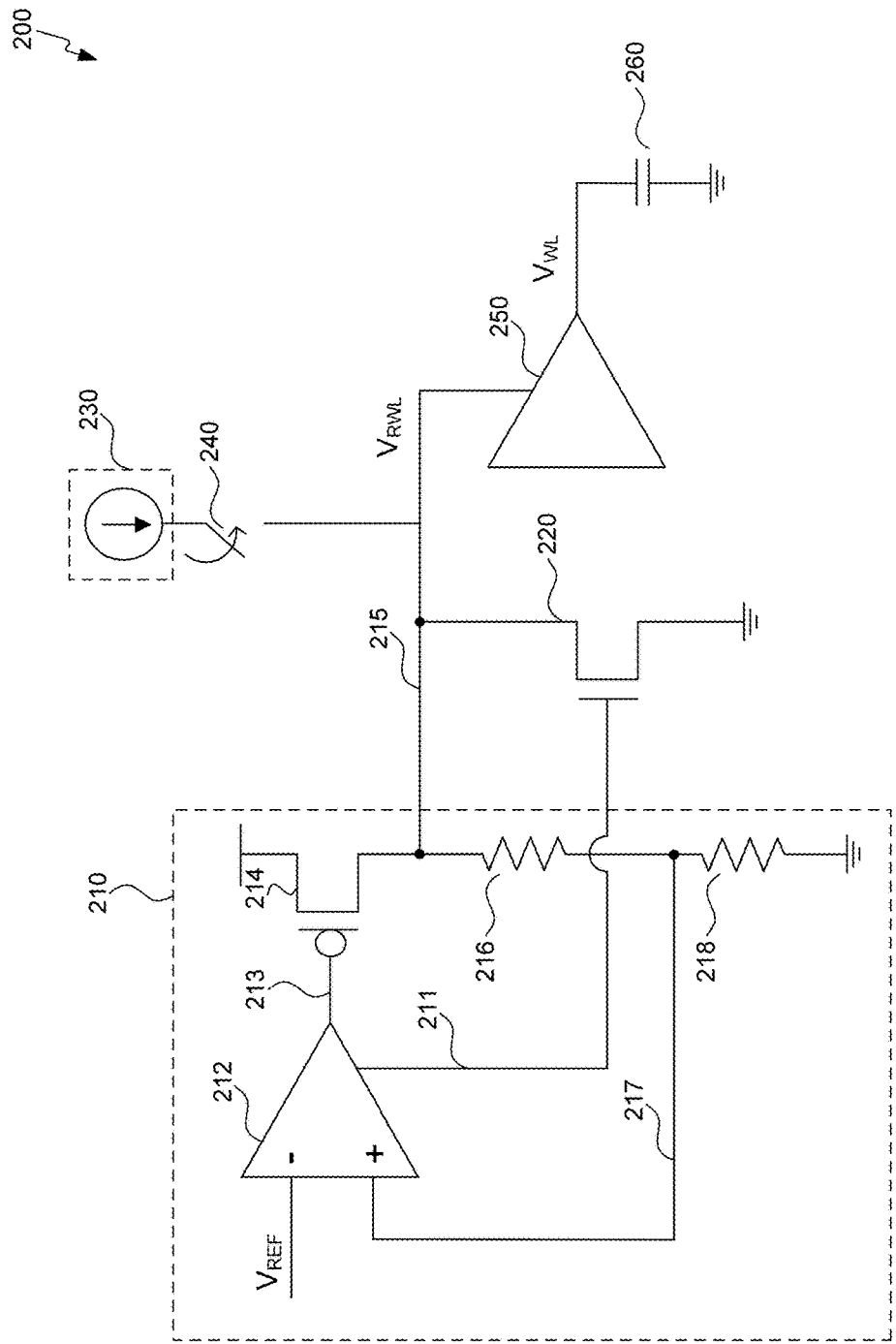
FIG. 2 is an illustration of a driver circuit in a memory system, according to some embodiments.

FIG. 2 is an illustration of a driver circuit 200, according to some embodiments. Driver circuit 200 includes a linear regulator 210, a pull-down transistor 220, a boost current generator 230, a switch 240, a wordline driver 250, and a capacitor 260. Capacitor 260 represents the wordline capacitance "seen" by driver circuit 200 when coupled to a wordline in a memory block. In some embodiments, driver circuit 200 can be used to "boost" the settling time of a voltage applied to the wordlines of memory blocks $110_0$-$110_3$. The "boost" in settling time can be used during a read memory operation, in which flash memory cells along a wordline can be concurrently read, according to some embodiments.

Figure 3:
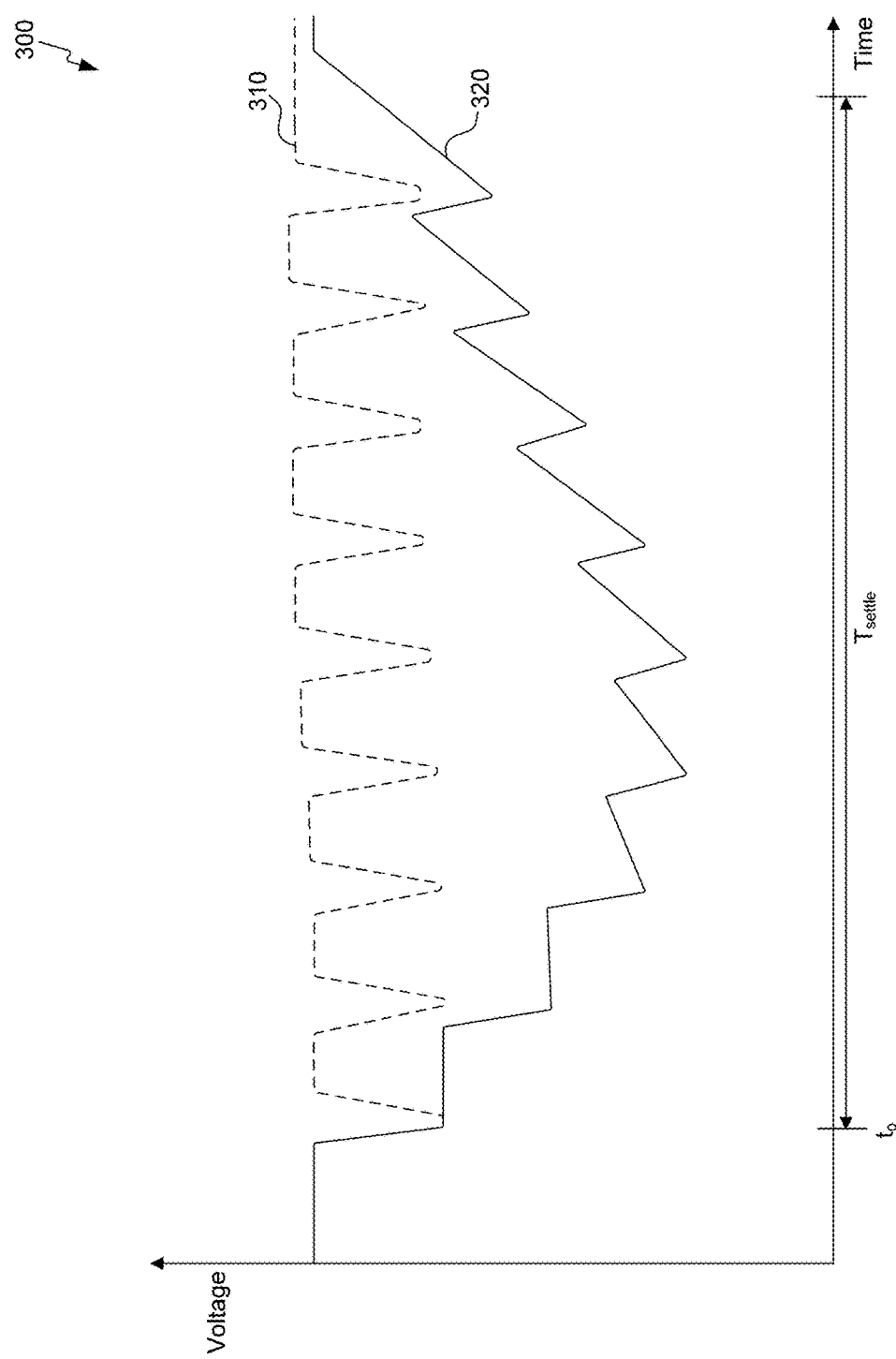
FIG. 3 is an illustration of example waveforms of an ideal driver circuit output and an actual driver circuit output subject to a voltage dip and settling time due to a wordline capacitance.

As would be understood by a person of ordinary skill in the art, when a voltage is initially applied to a wordline, a voltage "droop" at an output of the driver circuit can occur due to a wordline capacitance—in which a large portion of the wordline capacitance can be attributed to a gate capacitance of the flash memory cells connected to the wordline—and an initial current drawn from a wordline driver in the driver circuit. For example, FIG. 3 is an illustration of waveforms 300 of an ideal driver circuit output $V_{WL}$ 310 and a voltage droop and settling time for an actual driver circuit output $V_{WL}$ 320. At time $t_0$, the driver circuit is activated and driver circuit output $V_{WL}$ 320 is coupled to a wordline of a memory block. Due to the current drawn from the driver circuit's wordline driver and the wordline capacitance, driver circuit output $V_{WL}$ 320 droops (e.g., to a voltage level approximately equal to 90% of the ideal voltage) and recovers to a stable wordline voltage after a period of time $T_{settle}$. A read memory operation cannot be performed until driver circuit output $V_{WL}$ 320 reaches the stable wordline voltage. Thus, period of time $T_{settle}$ directly impacts read performance.

In referring to FIG. 2, driver circuit 200 reduces or shortens the wordline settling time (e.g., period of time $T_{settle}$). Linear regulator 210 maintains the wordline voltage within a predetermined voltage range, according to some embodiments. Linear regulator 210 includes a comparator 212, a transistor 214, a first resistor 216, and a second resistor 218. Comparator 212 includes two input terminals—a negative input terminal and a positive input terminal—and one output terminal. In some embodiments, the negative input terminal is coupled to a reference voltage $V_{REF}$, and the positive input terminal is coupled to a feedback voltage 217 generated by resistors 216 and 218. A value for reference voltage $V_{REF}$ can be determined based on a desired voltage for an internal voltage $V_{RWL}$, (which is substantially equal to an output voltage $V_{WL}$ of driver circuit 200) and feedback voltage 217 generated by resistors 216 and 218, according to some embodiments.

For example, if the desired internal voltage $V_{RWL}$, is approximately 5V and feedback voltage 217 generated by resistors 216 and 218 (with internal voltage $V_{RWL}$, applied at a top terminal of resistor 216) is approximately 2V, then the reference voltage $V_{REF}$ can be set to approximately 2V. With the reference voltage $V_{REF}$ set at this voltage level, the desired voltage level of internal voltage $V_{RWL}$ can be maintained by linear regulator 210. If the voltage level of internal voltage $V_{RWL}$, rises above the desired voltage level, feedback voltage 217 rises and causes comparator 212 to output a logic high voltage on a signal line 211. In some embodiments, the logic high voltage can be a positive supply voltage such as, for example, 1.2V, 1.8V, 2.4V, 3.3V, or 5V.

With the logic high voltage on signal line 211, pull-down transistor 220 conducts and "pulls" the voltage on a circuit node 215—which is the same node as internal voltage $V_{RWL}$—towards ground or 0V. In effect, pull-down transistor 220 prevents an overshoot in the wordline voltage. In some embodiments, pull-down transistor 220 can be an n-channel metal-oxide-semiconductor field-effect transistor. When the voltage on circuit node 215 lowers to approximately the desired voltage level of internal voltage $V_{RWL}$, comparator 212 transitions the logic high voltage on signal line 211 to a logic low voltage, thus turning OFF pull-down transistor 220. In some embodiments, the logic low voltage can be 0V or ground. A person of ordinary skill in the art will recognize that the logic high and logic low voltages can have other voltage values. These other voltage values are within the spirit and scope of the present disclosure.

Linear regulator 210 also maintains the voltage on circuit node 215 above a minimum voltage level, according to some embodiments. In some embodiments, the minimum voltage level can be a voltage associated with a power supply voltage (e.g., 1.2V, 1.8V, 2.4V, 3.3V, or 5V). Based on the description herein, a person of ordinary skill in the art will understand that the minimum voltage level can be set to other voltage values, which are within the spirit and scope of the present disclosure. If the voltage on circuit node 215 falls below the minimum voltage level, comparator 212 lowers the voltage on signal line 213 so that the source to gate voltage $V_{SG}$ of transistor 214 is increased. In turn, the increase in the gate voltage $V_{SG}$ of transistor 214 increases the current of transistor 214. Hence, the voltage on circuit node 215—the same circuit node as internal voltage $V_{RWL}$— is "pulled up" (e.g., is a voltage level at or near the power supply voltage). In some embodiments, transistor 214 can be a p-channel metal-oxide-semiconductor field-effect transistor.

In referring to FIG. 2, boost current generator 230 and switch 240 are used to provide current to a wordline, via wordline driver 250, when driver circuit 200 is coupled to the wordline. In some embodiments, wordline driver 250 transfers the current from boost current generator 230 to the wordline. In turn, the current provided by boost current generator 230 "boosts" the settling time of the voltage applied to the wordline, thus reducing or lessening the wordline voltage settling time (e.g., period of time $T_{settle}$), according to some embodiments. For example, during a read memory operation, switch 240 is closed, thus connecting boost current generator 230 to circuit node 215. Boost current generator 230 can be coupled to the wordline, via wordline driver 250, for a predetermined amount of time such that the voltage droop on the wordline and the period of time $T_{settle}$ to reach a stable wordline voltage can be reduced or lessened. In some embodiments, the current delivered by boost current generator 230 can be determined based on the wordline capacitance (represented by capacitor 260), the amount of current initially drawn by wordline driver 250 when activated, and a desired period of time $T_{settle}$ to reach the stable wordline voltage. A person of ordinary skill in the art will understand that a tradeoff may exist between achieving an aggressive (or shorter) period of time $T_{settle}$ to reach the stable wordline voltage and the circuit size of boost current generator 230. The aggressive period of time $T_{settle}$ to reach the stable wordline voltage may require a larger current to be provided by boost current generator 230. On the other hand, to provide the larger current, the circuit size of boost current generator 230 may grow accordingly.

Figure 4:
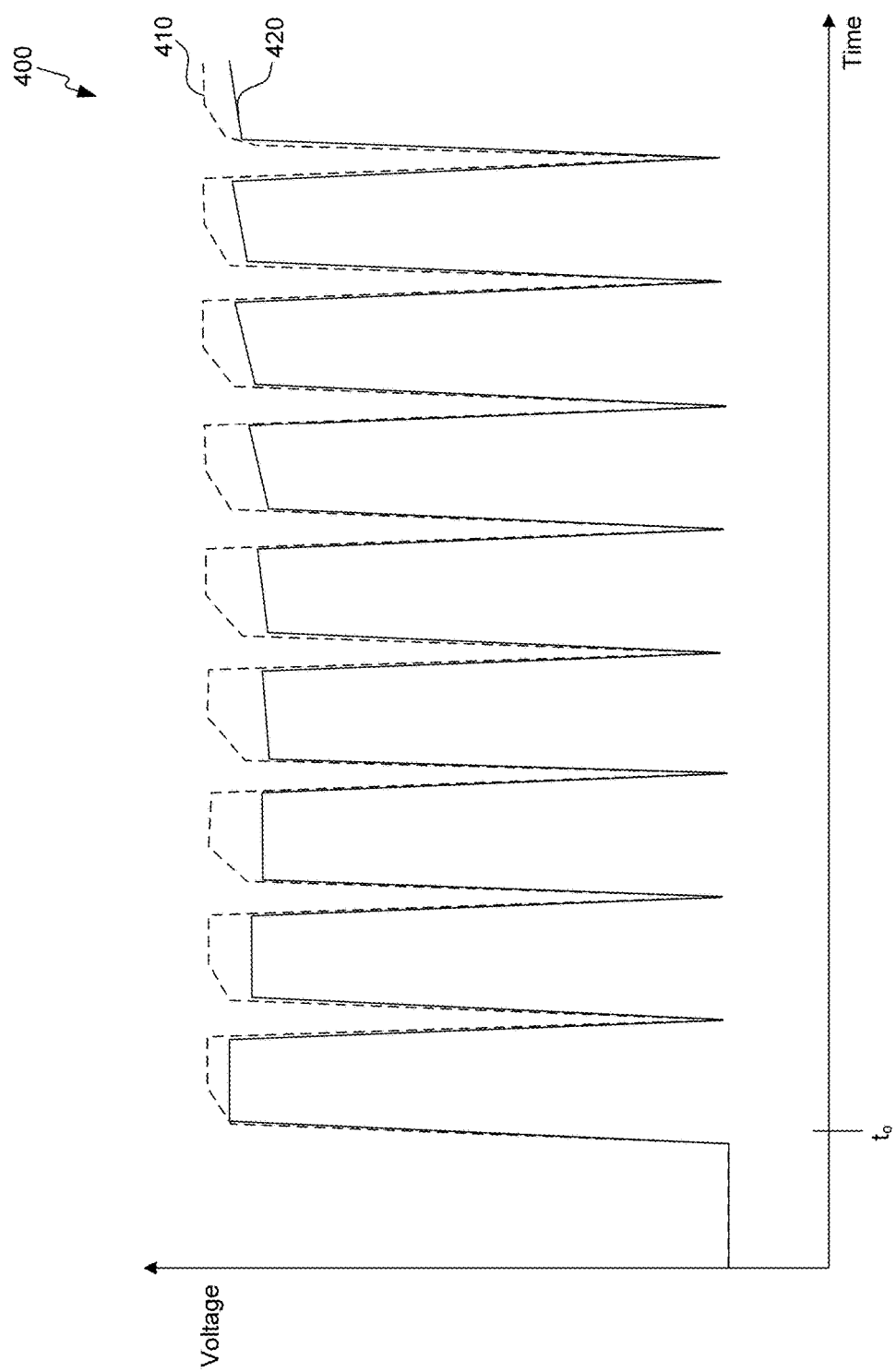
FIG. 4 is an illustration of example waveforms of an ideal driver circuit output and an actual driver circuit output with an addition of current provided by a boost current generator, according to some embodiments.

FIG. 4 is an illustration of example waveforms 400 of an ideal driver circuit output $V_{WL}$ 410 and an actual driver circuit output $V_{WL}$ 420 with the addition of current provided by boost current generator 230 (e.g., wordline driver 250 of FIG. 2), according to some embodiments. At time $t_0$, the driver circuit is activated and driver circuit output $V_{WL}$ 420 is coupled to a wordline of a memory block. Due to the current provided by boost current generator 230, the voltage at driver circuit output $V_{WL}$ 420 does not appreciably droop, thus no recovery time to reach a stable wordline voltage is required. As a result, a read memory operation can be performed immediately and read performance is improved.

In referring to FIG. 1, adjustment circuit 140 is coupled to sense amplifier circuits $130_0$ and $130_1$. Sense amplifier circuits $130_0$ and $130_1$ can be used in, for example, read and verify modes of memory operation. In some embodiments, sense amplifier circuit $130_0$ can be used to process bitline signals from memory blocks $110_0$ and $110_2$. Similarly, sense amplifier circuit $130_1$ can be used to process bitline signals from memory blocks $110_1$ and $110_3$. Though not illustrated in FIG. 1, in some embodiments, a single sense amplifier circuit or more than two sense amplifier circuits can be used to process bitline signals from memory blocks $110_0$-$110_3$.

As would be understood by a person of ordinary skill in the art, the memory cells in memory blocks $110_0$-$110_3$ can be accessed and biased at particular voltage levels such that a corresponding current level is detected, via the memory blocks' bitlines, by sense amplifier circuits $130_0$ and $130_1$. These corresponding bitline current levels can be processed by sense amplifier circuits $130_0$ and $130_1$ to determine, during the read memory operation, a value stored in a memory cell—e.g., a logic '1' or logic '0' if the memory cell is a single bit per cell flash memory; or, one of multiple values if the memory cell is a multi-level flash memory cell. During the verify memory operation, the corresponding bitline current levels can be processed by sense amplifier circuits $130_0$ and $130_1$ to determine whether a memory cell has been sufficiently programmed or erased to certain voltage levels.

Figure 5:
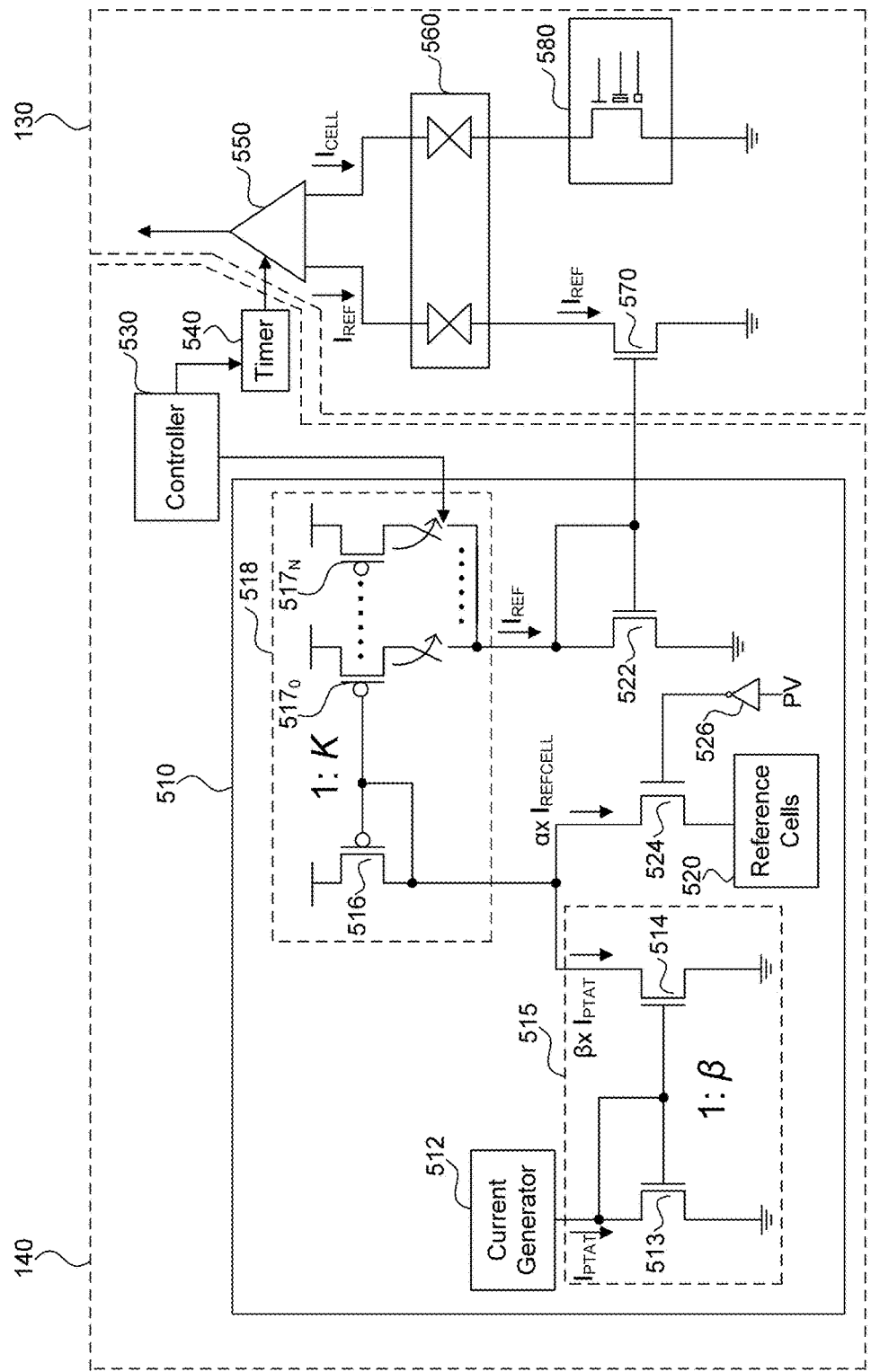
FIG. 5 is an illustration of an adjustment circuit coupled to a sense amplifier, according to some embodiments.

FIG. 5 is an illustration of adjustment circuit 140 coupled to sense amplifier circuit 130, according to some embodiments. Adjustment circuit 140 includes a temperature adaptive reference (TAR) generator 510, a controller circuit 530, and a timer circuit 540. Sense amplifier circuit 130 includes an amplifier circuit 550, a multiplexer circuit 560, a mirror transistor 570, and an accessed flash memory cell 580.

In some embodiments, adjustment circuit 140 has two functions: (1) adjust a verify reference current (also referred to herein as "verify reference current $I_{REF}$" or "$I_{REF}$") based on temperature, where the verify reference current is set based on a memory type (e.g., code memory or data memory); and (2) adjust a read speed of memory system 100 based on a memory type. With regard to the first function, the verify reference current can be adjusted based on temperature using TAR generator 510, according to some embodiments. TAR generator 510 includes a current generator 512, a first current mirror circuit 515, a second current mirror circuit 518, reference cells 520, a load transistor 522, a pass transistor 524, and a program verify control device 526. Current generator 512 can be a bandgap reference current generator configured to output a proportional to absolute temperature (PTAT) current $I_{PTAT}$, according to some embodiments.

First current mirror circuit 515 is configured to receive the PTAT current ($I_{PTAT}$) from current generator 512 and to multiply the PTAT current by a factor β, according to some embodiments. First current mirror circuit 515 includes a transistor 513 and a transistor 514. Transistor 513 can be an n-channel metal-oxide-semiconductor field-effect transistor ("NMOS transistor") that has its drain terminal connected to its gate terminal. Transistor 514 can be an NMOS transistor with its gate terminal connected to the gate terminal of transistor 513. Transistor 514 generates the multiplied PTAT current ($\beta \times I_{PTAT}$). In some embodiments, the multiplied PTAT current ($\beta \times I_{PTAT}$) can be achieved by sizing a gate width dimension of transistor 514 such that the gate width dimension is a factor $\beta$ larger than a gate width dimension of transistor 513. A person of ordinary skill in the art will recognize other techniques can be used to achieve the multiplied PTAT current ($\beta \times I_{PTAT}$). These other techniques are within the spirit and scope of the present disclosure.

During an erase verify memory operation, an input to program verify control device 526 can be set to a logic low value (e.g., 0V or ground), thus allowing pass transistor 524 to pass a current generated by reference cells 520. Reference cells 520 can be a plurality of flash memory cells connected in a parallel manner and biased in a predetermined manner such that each reference cell generates a current $I_{REFCELL}$, according to some embodiments. Cumulatively, the total current generated by reference cells 520 can be equated as $\alpha \times I_{REFCELL}$, where $\alpha$ indicates the number of reference cells connected in parallel, according to some embodiments.

During the erase verify memory operation, second current mirror circuit 518 is configured to receive a summation (or combination) of the multiplied PTAT current ($\beta \times I_{PTAT}$) from first current mirror circuit 515 and the total current generated by reference cells 520 ($\alpha \times I_{REFCELL}$). For brevity, the result from this summation or combination of currents ($[\beta \times I_{PTAT}]+[\alpha \times I_{REFCELL}]$) is also referred to herein as the "modified reference cell current." In some embodiments, second current mirror circuit 518 is configured to multiply the modified reference cell current by a factor K—where K is based on a number of transistors 517 connected in parallel—to generate a verify reference current $I_{REF}$.

During a program verify memory operation, the input to program verify control device 526 is set to a logic high value (e.g., a power supply voltage), thus preventing pass transistor 524 to pass the current generated by reference cells 520. Second current mirror circuit 518 is configured to receive the multiplied PTAT current ($\beta \times I_{PTAT}$) from first current mirror circuit 515 and to multiply this current by the factor K to generate the verify reference current $I_{REF}$.

Second current mirror circuit 518 includes a transistor 516 and transistors $517_0$-$517_N$. Transistor 516 can be a p-channel metal-oxide-semiconductor field-effect transistor ("PMOS transistor") that has its drain terminal connected to its gate terminal. Transistors $517_0$-$517_N$ can be PMOS transistors with their gate terminals connected to the gate terminal of transistor 516. In some embodiments, based on a control signal provided by controller circuit 530, one or more transistors $517_0$-$517_N$ are connected in parallel and to load transistor 522 to generate the verify reference current $I_{REF}$: (i) for an erase verify memory operation, $I_{REF}=([\beta \times I_{PTAT}]+[\alpha \times I_{REFCELL}]) \times K$, in which K is equal to the number of transistors $517_0$-$517_N$ connected in parallel and to load transistor 522; and (ii) for a program verify operation, $I_{REF}=(\beta \times I_{PTAT}) \times K$. In some embodiments, the control signal can be a high endurance mode (HEM) signal. The HEM signal can indicate a type of memory sector—e.g., a data memory sector or a code memory sector—that is accessed during a verify memory operation. As discussed above, a data memory sector can be considered "high endurance" because of its frequent exposure to high voltages during program and erase memory operations, whereas a code memory sector can be considered "low endurance" because it has less exposure to the high voltages. As described herein, the verify reference current is set by the one or more transistors $517_0$-$517_N$ connected to load transistor 522, in which the verify reference current is adjusted by current generator 512, first current mirror circuit 515, and reference cells 520 based on temperature.

The HEM signal provided by controller circuit 530 indicates a type of memory performing the verify memory operation, according to some embodiments. For example, in referring to FIG. 1, each of memory blocks $110_0$-$110_3$ is partitioned into different types of memory such as, for example, code memory and data memory. If the code memory in a memory block performs the erase verify memory operation, then the HEM signal can be set to a value (e.g., HEM='0') to indicate to TAR generator 510 that an erase verify reference current associated with the code memory should be used. If the data memory in a memory block performs the erase verify memory operation, then the HEM signal can be set to another value (e.g., HEM='1') to indicate to TAR generator 510 that an erase verify reference current associated with the data memory should be used. Program verify reference currents can be provided to the code memory and the data memory in each of the memory blocks in a similar manner.

In some embodiments, the erase verify reference current for the data memory (e.g., HEM='0') is lower than the erase verify reference current for the code memory (e.g., HEM='1'). As described above, by setting a lower erase verify reference current for the data memory (which can be accessed more frequently than the code memory), the memory cells are erased more lightly—thus mitigating gate oxide stress and extending cycling performance. In referring to FIG. 5, factor K in second current mirror 518 (representative of the number of transistors $517_0$-$517_N$ connected to load transistor 522) is lower for the data memory as compared to the factor K for the code memory, according to some embodiments. Further, the erase verify reference currents for the code memory and the data memory can be adjusted to erase memory cells more "deeply" (e.g., the erase verify reference currents are set to a higher value by increasing the factor K, which increases the number of transistors $517_0$-$517_N$ connected to load transistor 522) or more "lightly" (e.g., the erase verify reference currents are set to a lower value by decreasing the factor K, which decreases the number of transistors $517_0$-$517_N$ connected to load transistor 522), according to some embodiments. As would be understood by a person of ordinary skill in the art, transistors $517_0$-$517_N$ can be coupled to switches controlled by logic circuitry to selectively connect one or more transistors $517_0$-$517_N$ to load transistor 522. These switches and logic circuitry are not shown in FIG. 5 for simplicity purposes but are within the spirit and scope of this disclosure. Program verify reference currents for the code memory and the data memory can be adjusted in a similar manner.

In referring to FIG. 5, the verify reference current $I_{REF}$ generated by adjustment circuit 140 is provided to sense amplifier circuit 130 via load transistor 522 and mirror transistor 570. In sense amplifier circuit 130, mirror transistor 570 provides the verify reference current $I_{REF}$ to an input of amplifier circuit 550 via multiplexer 560. In some embodiments, multiplexer 560 represents a data path to access the verify reference current $I_{REF}$ and/or a particular memory cell through, for example, a hierarchy of decoding levels. Another input of amplifier circuit 550 receives a current generated by accessed flash memory cell 580 via multiplexer 560. As would be understood by a person of ordinary skill in the art, during a program or erase verify memory operation, one or more terminals of accessed flash memory cell 580 can be biased with appropriate voltages. Based on these bias voltages, accessed flash memory cell 580 can provide a current $I_{CELL}$ to amplifier circuit 550 via multiplexer 560. Amplifier circuit 550 compares the difference between the verify reference current $I_{REF}$ and the accessed flash memory cell's current $I_{CELL}$. As would be understood by a person of ordinary skill in the art, based on this difference, amplifier circuit 550 outputs a signal that indicates whether accessed flash memory cell 580 has been appropriately programmed or erased.

An issue, among others, addressed by the above embodiments is weakly programmed and/or weakly erased flash memory cells. As would be understood by a person of ordinary skill in the art, flash memory cells are programmed and erased to particular threshold voltages. For a program memory operation, flash memory cells are programmed such that the cells are within a program threshold voltage distribution. And for a erase memory operation, flash memory cells are erased such that the cells are within an erase threshold voltage distribution. The program and erase threshold voltage distributions can be determined by the flash memory manufacturer. Flash memory cells that reside at a lower threshold voltage in the program threshold voltage distribution are considered "weakly programmed cells." Flash cells that reside at a higher threshold voltage in the erase threshold voltage distribution are considered "weakly erased cells."

To reduce a high voltage stress applied to the flash memory cells during program and erase memory operations, incremental step program pulse (ISPP) and incremental step erase pulse (ISEP) schemes may be used, respectively. Consequently, the ISPP scheme can result in weakly programmed flash memory cells, where the cell current in these cells are higher than that of a strongly programmed cell. The ISEP scheme can result in a weakly erased flash memory cells, where the cell current in these cells are lower than that of a strongly erased cell. With weakly programmed and erased cells, a read window between the associated cell currents ($I_{CELL}$) and a reference current for a read memory operation can be insufficient across temperature.

Figure 6:
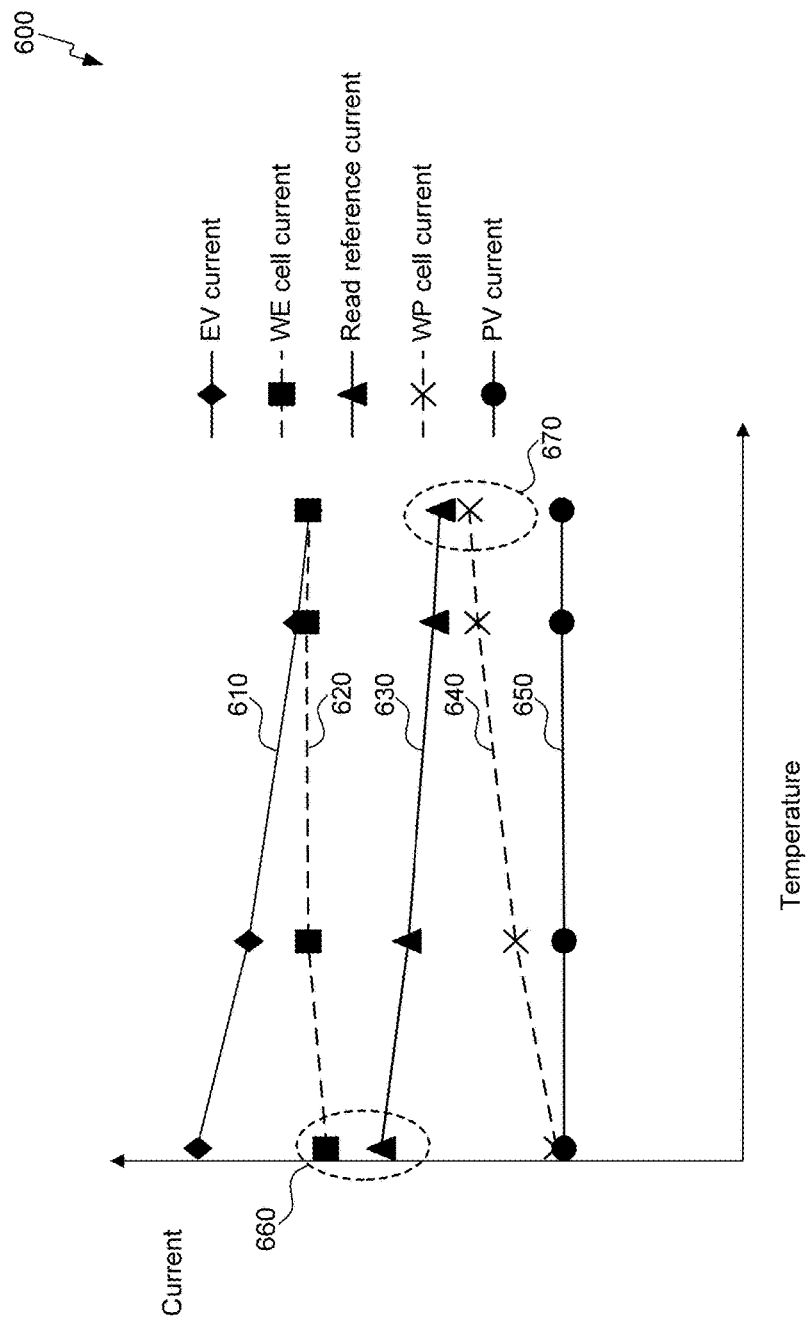
FIG. 6 is an illustration of example waveforms of weakly programmed flash memory cells and weakly erased flash memory cells without temperature compensation.

FIG. 6 is an illustration of example waveforms 600 of weakly programmed flash memory cells and flash memory cells and weakly erased flash memory cells without temperature compensation. Example waveforms 600 show a read reference current (waveform 630) with a negative temperature coefficient as temperature rises. Conversely, the cell current for weakly programmed cells (waveform 640) has a positive temperature coefficient as temperature rises. The cell current for weakly erased cells (waveform 620) also has a positive temperature coefficient—albeit less than the positive temperature coefficient of the weakly programmed cells—as temperature rises.

If flash memory cells are weakly programmed and pass program verify (waveform 650) at lower temperatures but are read at higher temperatures, a read window 670 at the higher temperature can result in a diminished margin between the cells' current (waveform 640) and the reference current for the read memory operation (waveform 630). Similarly, if flash memory cells are weakly erased and pass erase verify (waveform 610) at higher temperatures but are read at lower temperatures, read window 660 at the lower temperature can also result in a diminished margin between the cells' current (waveform 620) and the reference current for the read memory operation (waveform 630).

Adjustment circuit 140 addresses the above read window issues, according to some embodiments. In some embodiments, in referring to FIG. 5, TAR generator 510 in adjustment circuit 140 can adjust the program verify reference current so that it closely tracks weakly programmed cells across temperature. TAR generator 510 can also adjust the erase verify reference current so that it closely tracks weakly erased cells across temperature, according to some embodiments. These adjustments made by TAR generator 510 are described below.

Figure 7:
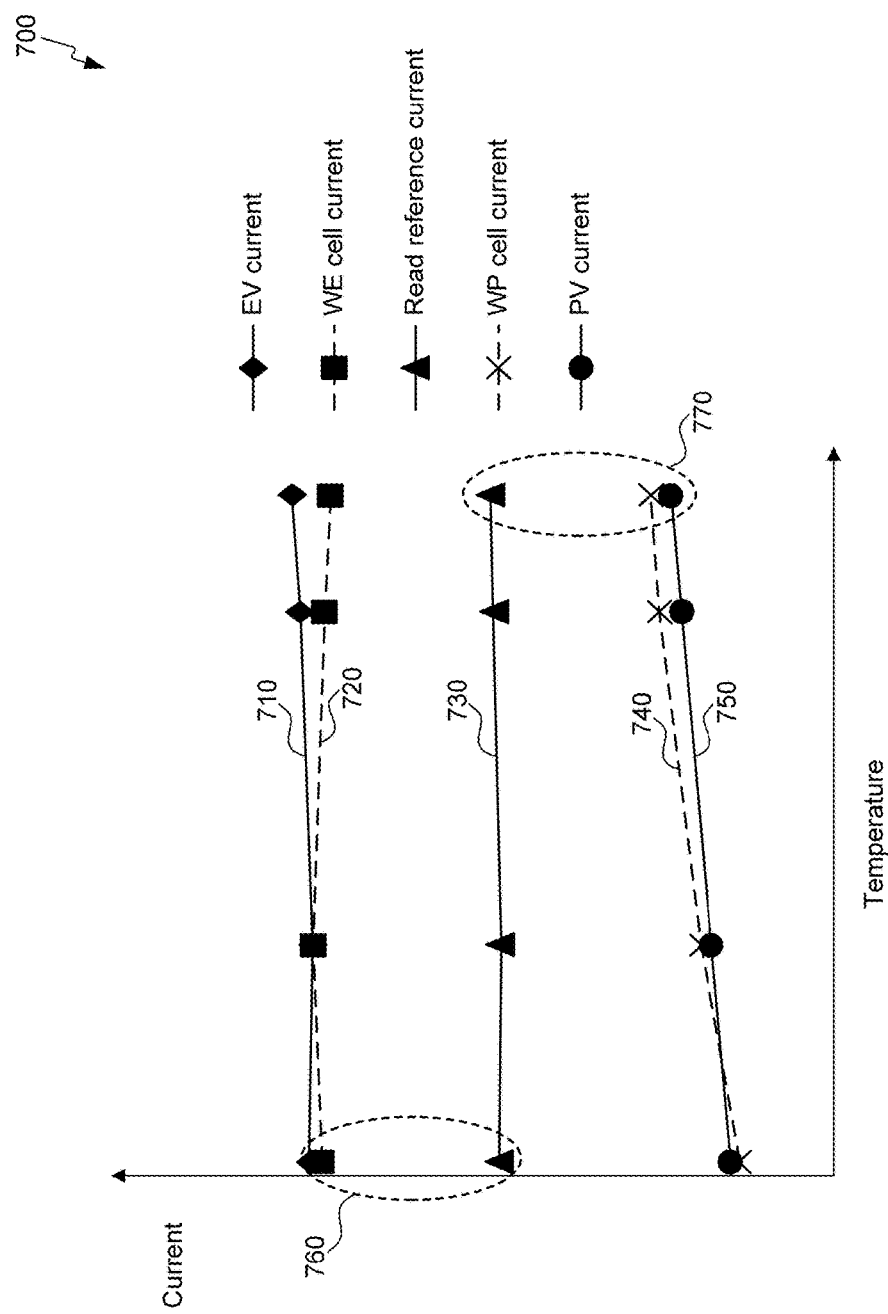
FIG. 7 is an illustration of example waveforms of weakly programmed flash memory cells and weakly erased flash memory cells with temperature compensation, according to some embodiments.

FIG. 7 is an illustration of example waveforms 700 of weakly programmed flash memory cells and weakly erased flash memory cells with temperature compensation, according to some embodiments. With temperature compensation provided by TAR generator 510, a program verify reference current (waveform 750) closely tracks currents for weakly programmed cells (waveform 740) and provides a wider read window 770 than read window 670 from FIG. 6 (without temperature compensation). In addition, to further widen read window 770, the program verify reference current can be set to a lower value so that the margin between the cells' current and the reference current for the read memory operation is further increased across temperature.

Further, with temperature compensation provided by TAR generator 510, an erase verify reference current (waveform 710) closely tracks currents for weakly erased cells (waveform 720) and provides a wider read window 760 than read window 660 (without temperature compensation). Read windows 760 and 770 can be achieved by setting values for coefficients K, α, and β (coefficients are described above with respect to FIG. 5) associated with the verify reference current to achieve the desired read windows, according to some embodiments.

In some embodiments, after setting values for the coefficients associated with the program verify and erase verify reference currents, the temperature coefficient for the read reference current can be adjusted from negative to near or at zero. The read reference current—which is equal to ([β× $I_{PTAT}$][α× $I_{REFCELL}$])×K—has a positive temperature coefficient. The output of the bandgap reference current generator ($I_{PTAT}$) has a negative temperature coefficient. Values for factors α and β can be set to appropriate values to derive a resulting temperature coefficient at or near zero. Waveform 730 in FIG. 7 shows a relatively constant read reference current across temperature.

In referring to FIG. 5, with regard to the second function of adjustment circuit 140, the read speed of memory system 100 can be adjusted based on memory type. Timer circuit 540 is configured to receive a control signal from controller 530 and output a timing signal to sense amplifier circuit 130 based on the control signal, according to some embodiments. In some embodiments, the control signal can be a high endurance mode (HEM) signal. The HEM signal can indicate a type of memory sector—e.g., a data memory sector or a code memory sector—that is accessed during a read memory operation. As discussed above, a data memory sector can be considered "high endurance" because of its frequent exposure to high voltages during program and erase memory operations, whereas a code memory sector can be considered "low endurance" because it has less exposure to the high voltages.

For example, in referring to FIG. 1, each of memory blocks $110_0$-$110_3$ is partitioned into different types of memory such as, for example, code memory and data memory. The HEM signal can be set to a value (e.g., HEM='0') to indicate to timer circuit 540 that a read timer value (outputted from timer circuit 540) associated with the code memory should be used. The HEM signal can be set to another value (e.g., HEM='1') to indicate to timer circuit 540 that a read timer value (outputted from timer circuit 540) associated with the data memory should be used. Based on the HEM signal provided by controller 530 (which sets the read timer value output of timer circuit 540), amplifier circuit 550 is activated for a period of time set by the read timer value, according to some embodiments. In turn, within the period of time set by the read timer value, amplifier circuit 550 can compare a current generated by accessed flash memory cell 580 (which is biased for the read memory operation) and a read reference current. In some embodiments, the read reference current can be generated in a similar manner as the verify reference current described above.

In some embodiments, the read timer value associated with the code memory (e.g., approximately 5 ns) can be less than the read timer value associated with the data memory (e.g., approximately 8 ns). As described above, the data memory can be considered "high endurance" because of its frequent exposure to high voltages during program and erase memory operations, whereas the code memory sector can be considered "low endurance" because it has less exposure to the high voltages. To mitigate stress breakdown in the data memory sector of a memory block, a lower verify reference current can be used in the data memory sector as compared to the verify reference current used in the code memory sector. By using a lower verify reference current for the data memory cells, these cells are erased more lightly, thus mitigating gate oxide stress and extending cycling endurance. Consequently, with the lower verify reference current, data memory cells can take a longer time to charge its bitlines for a read memory operation. In turn, the read timer value associated with data memory is longer than the read timer value associated with code memory.

Figure 8:
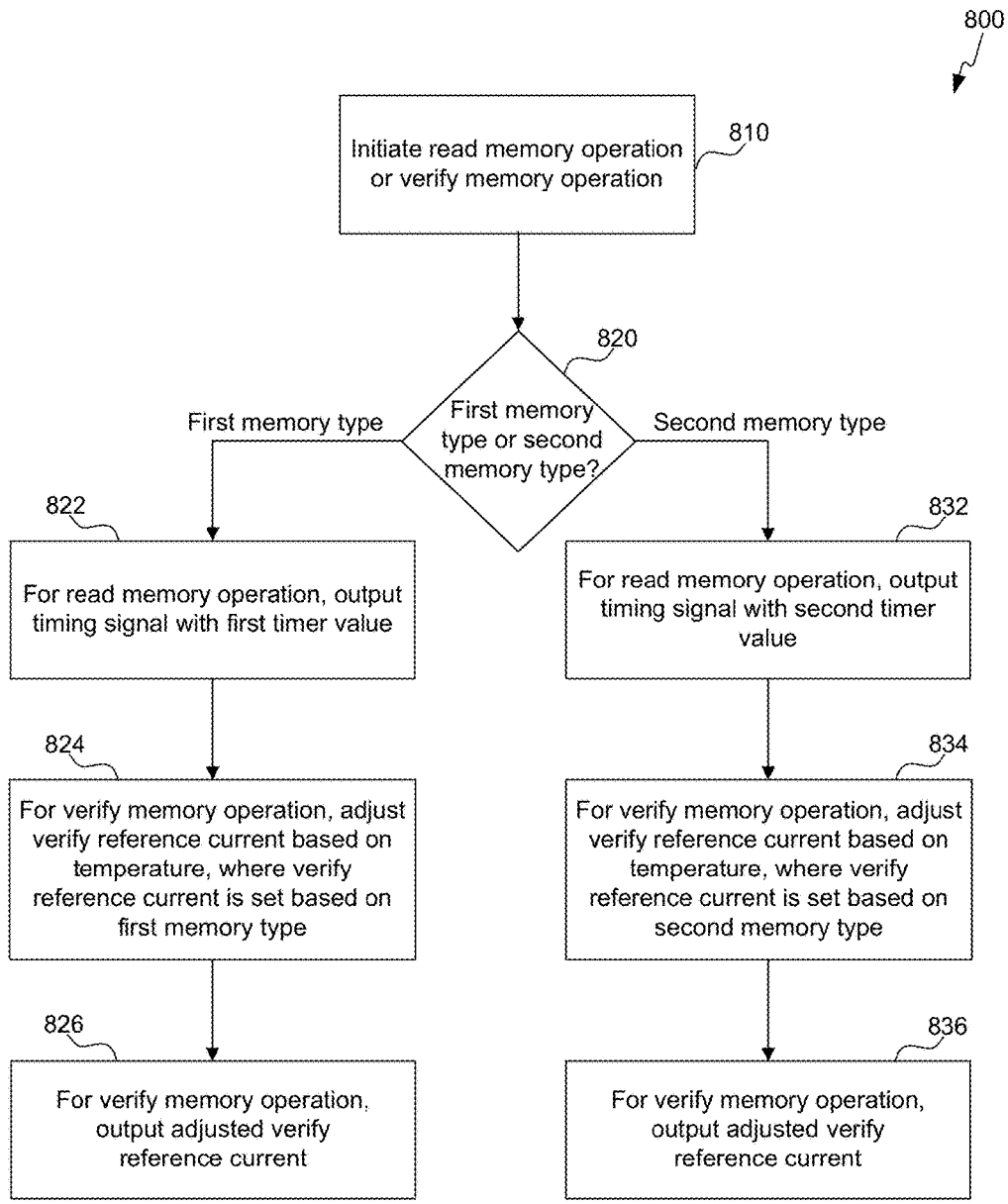
FIG. 8 is an illustration of a method for memory operations, according to some embodiments.

FIG. 8 is an illustration of a method 800 for memory operations, according to some embodiments. The operations shown in method 800 can be performed by, for example, adjustment circuit 140 of FIGS. 1 and 5. Based on the disclosure herein, a person of ordinary skill in the art will recognize that other operations in method 800 can be performed. Further, a person of ordinary skill in the art will recognize that the operations of method 800 can be performed in a different order and/or vary.

At operation 810, a memory system (e.g., memory system 100 of FIG. 1) initiates a read memory operation or a verify memory operation. In some embodiments, the verify memory operation includes a program verify memory operation or an erase verify memory operation.

At operation 820, a determination is made whether a high endurance mode (HEM) signal indicates a first memory type or a second memory type. In some embodiments, the first memory type can include code memory, and the second memory type can include data memory. The memory space allocated to the data memory can be dynamically adjusted, according to some embodiments. Controller circuit 530 in FIG. 5 can transmit a high endurance mode (HEM) signal that indicates the memory type. For example, if the HEM signal is set to '0', then this indicates that the memory operation is performed on code memory. And, if then HEM signal is set to '1', then this indicates that the memory operation is performed on data memory.

At operation 820, in response to determining the HEM signal indicates the first memory type (e.g., code memory), three operations can be performed. First, at 822, for a read memory operation, a timing signal with a first timer value is outputted to a sense amplifier circuit. Timer circuit 540 of FIG. 5 can, for example, output the timing signal to sense amplifier circuit 130. Second, at 824, for a verify memory operation, a verify reference current is adjusted based on temperature. The verify reference current is set based on the first memory type (e.g., code memory). And third, at 826, for the verify memory operation, the adjusted verify reference current is outputted to the sense amplifier. This operation can include the following: outputting a proportional to absolute temperature (PTAT) current; multiplying the PTAT current to generate a modified PTAT current; and generating the adjusted verify reference current based on the modified PTAT current. TAR generator 510 of FIG. 5 can output the adjusted verify reference current to sense amplifier circuit 130.

At operation 820, in response to determining the HEM signal indicates the second memory type (e.g., data memory), three operations can be performed. First, at 832, for a read memory operation, a timing signal with a second timer value is outputted to a sense amplifier circuit. In some embodiments, the second timer value is greater than the first timer value. Timer circuit 540 of FIG. 5 can, for example, output the timing signal to sense amplifier circuit 130. Second, at 834, for a verify memory operation, a verify reference current is adjusted based on temperature. The verify reference current is set based on the second memory type (e.g., data memory). And third, at 836, for the verify memory operation, the adjusted verify reference current is outputted to the sense amplifier. This operation can include the following: outputting a proportional to absolute temperature (PTAT) current; multiplying the PTAT current to generate a modified PTAT current; and generating the adjusted verify reference current based on the modified PTAT current. TAR generator 510 of FIG. 5 can output the adjusted verify reference current to sense amplifier circuit 130.

The embodiments disclosed herein describe a memory system that includes partitioned memory blocks, an adjustment circuit, and a driver circuit. In some embodiments, one or more of the memory blocks can be partitioned into different memory sectors—e.g., code memory sectors and data memory sectors. By partitioning memory blocks into memory sectors, the memory system can be optimized to use it storage capacity efficiently. The adjustment circuit can be used to a read window of the memory system, according to some embodiments. For example, by adjusting verify reference currents based on temperature, read windows for programmed and erased flash memory cells can be maximized and reliable across temperature. To further improve the read performance of the memory system, the driver circuit can have "boost" function to reduce or lessen a wordline voltage settling period, according to some embodiments.

In some embodiments, an adjustment circuit can be used, for example, in a memory system with partitioned memory blocks. The adjustment circuit can include a controller circuit, a timer circuit, and a temperature adaptive reference (TAR) generator. The controller circuit can be configured to output a control signal that indicates a memory type associated with a partitioned memory block. The timer circuit can be configured to output a timing signal for a read memory operation based on the control signal. And, the TAR generator can be configured to adjust a verify reference current based on temperature, where the verify reference current is set based on the control signal.

In some embodiments, a memory system can include a memory array and an adjustment circuit. The memory array can be divided into a plurality of memory blocks. One or more of the memory blocks can be partitioned into memory sectors with respective memory types. Further, the adjustment circuit can include a controller circuit, a timer circuit, and a temperature adaptive reference (TAR) generator. The controller circuit can be configured to output a control signal that indicates a memory type associated with a partitioned memory block. The timer circuit can be configured to output a timing signal for a read memory operation based on the control signal. And, the TAR generator can be configured to adjust a verify reference current based on temperature, where the verify reference current is set based on the control signal.

In some embodiments, a method for memory operations can include determining whether a control signal indicates a first memory type or a second memory type. In response to a determination that the control signal indicates the first memory type, the method includes the following operations: adjusting a verify reference current based on temperature, where the verify reference current is set based on the first memory type; and outputting the adjusted verify reference current based on the first memory type to the sense amplifier. And, in response to a determination that the control signal indicates the second memory type, the method includes the following operations: adjusting the verify reference current based on temperature, where the verify reference current is set based on the second memory type; and outputting the adjusted verify reference current based on the second memory type to the sense amplifier.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. An adjustment circuit comprising:
   a controller circuit configured to output a control signal that indicates a memory type;
   a timer circuit configured to output a timing signal for a read memory operation based on the control signal;
   a temperature adaptive reference (TAR) generator configured to adjust a verify reference current for a verify memory operation based on temperature, wherein the verify reference current is set based on the control signal; and
   an amplifier circuit configured to:
      receive the timing signal, the verify current, and a current provided by a memory cell, wherein the amplifier circuit outputs a signal based on the timing signal, the verify current, and the memory cell current.

2. The adjustment circuit of claim 1, wherein the timing signal comprises a first timer value for a first memory type or a second timer value for a second memory type.

3. The adjustment circuit of claim 2, wherein the first memory type comprises code memory and the second memory type comprises data memory.

4. The adjustment circuit of claim 3, wherein memory space allocated to the data memory is dynamically adjustable.

5. The adjustment circuit of claim 1, wherein the TAR generator comprises:
   a bandgap reference current generator configured to output a proportional to absolute temperature (PTAT) current;
   a first current mirror circuit configured to multiply the PTAT current to generate a modified PTAT current; and
   a second current mirror circuit configured to multiply the modified PTAT current by a factor to generate the verify reference current, wherein the factor is determined based on the control signal.

6. The adjustment circuit of claim 5, wherein the second current mirror circuit is further configured to multiply a current provided by one or more reference cells to generate the verify reference current.

7. The adjustment circuit of claim 6, wherein the first memory type comprises code memory and the second memory type comprises data memory, and wherein memory space allocated to the data memory is dynamically adjustable.

8. The adjustment circuit of claim 5, wherein the TAR generator further comprises a third current mirror circuit configured to couple the verify reference current from the second current mirror circuit to the amplifier circuit.

9. A memory system, comprising:
   a memory array divided into a plurality of memory blocks, wherein one or more of the plurality of memory blocks is partitioned into memory sectors associated with respective memory types; and
   an adjustment circuit comprising:
      a controller circuit configured to output a control signal that indicates a memory type;
      a timer circuit configured to output a timing signal to the plurality of memory blocks for a read memory operation based on the control signal;
      a temperature adaptive reference (TAR) generator configured to adjust a verify reference current for a verify memory operation based on temperature, wherein the verify reference current is set based on the control signal; and
      an amplifier circuit configured to:
         receive the timing signal, the verified current, and a current provided by a memory cell of the plurality of memory blocks; and
         compare the verify current and the current provided by the memory cell for a duration based on the timing signal.

10. The memory system of claim 9, wherein the timing signal comprises a first timer value for a first memory type or a second timer value for a second memory type.

11. The memory system of claim 10, wherein the first memory type comprises code memory and the second memory type comprises data memory.

12. The memory system of claim 11, wherein memory space allocated to the data memory is dynamically adjustable.

13. The memory system of claim 9, wherein the TAR generator comprises:
   a bandgap reference current generator configured to output a proportional to absolute temperature (PTAT) current;
   a first current mirror circuit configured to multiply the PTAT current to generate a modified PTAT current;

a second current mirror circuit configured to generate the adjusted verify reference current based on the modified PTAT current, wherein the second current mirror circuit comprises a plurality of selectable transistors selected based on the control signal.

14. The memory system of claim 13, wherein the plurality of selectable transistors are selected based on a first memory type or a second memory type.

15. The memory system of claim 14, wherein the first memory type comprises code memory and the second memory type comprises data memory.

16. The memory system of claim 15, wherein memory space allocated to the data memory is dynamically adjustable.

17. A method for memory operations, comprising:
    determining whether a control signal indicates a first memory type or a second memory type;
    in response to the determining the control signal indicates the first memory type:
        activating a sense amplifier for a first duration for a read memory operation;
        adjusting a verify reference current based on temperature, wherein the verify reference current is set based on the first memory type; and
        outputting the adjusted verify reference current to the sense amplifier for a verify memory operation; and
    in response to the determining the control signal indicates the second memory type:
        activating a sense amplifier for a second duration for the read memory operation;
        adjusting the verify reference current based on temperature, wherein the verify reference current is set based on the second memory type; and
        outputting the adjusted verify reference current to the sense amplifier for the verify memory operation.

18. The method of claim 17, wherein the first memory type comprises code memory and the second memory type comprises data memory, and wherein the first timer value is less than the second timer value.

19. The method of claim 17, wherein adjusting the verify reference current based on current comprises:
    outputting a proportional to absolute temperature (PTAT) current;
    outputting a reference cell current;
    multiplying the PTAT current and the reference cell current to generate a modified PTAT current; and
    generating the adjusted verify reference current based on the modified PTAT current.

20. The method of claim 19, wherein generating the adjusted verify reference current comprises selecting one or more transistors based on the control signal.

* * * * *